(12) United States Patent
Shen et al.

(10) Patent No.: US 12,211,845 B2
(45) Date of Patent: *Jan. 28, 2025

(54) SEMICONDUCTOR DEVICE AND A METHOD FOR FABRICATING THE SAME

(71) Applicant: TAIWAN SEMICONDUCTOR MANUFACTURING COMPANY, LTD., Hsinchu (TW)

(72) Inventors: Hsiang-Ku Shen, Hsinchu (TW); Chih Wei Lu, Hsinchu (TW); Hui-Chi Chen, Hsinchu (TW); Jeng-Ya David Yeh, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/075,119

(22) Filed: Dec. 5, 2022

(65) Prior Publication Data
US 2023/0111553 A1 Apr. 13, 2023

Related U.S. Application Data

(60) Continuation of application No. 17/063,243, filed on Oct. 5, 2020, now Pat. No. 11,521,970, which is a
(Continued)

(51) Int. Cl.
*H01L 27/088* (2006.01)
*H01L 21/768* (2006.01)
(Continued)

(52) U.S. Cl.
CPC .... *H01L 27/0886* (2013.01); *H01L 21/76831* (2013.01); *H01L 21/76897* (2013.01);
(Continued)

(58) Field of Classification Search
CPC ......... H01L 27/0886; H01L 21/823468; H01L 21/31053; H01L 21/823437;
(Continued)

(56) References Cited

U.S. PATENT DOCUMENTS 6,281,059 B1   8/2001 Cheng et al.
6,291,296 B1   9/2001 Hui et al.
(Continued)

OTHER PUBLICATIONS

Final Office Action issued in U.S. Appl. No. 15/141,476, dated Apr. 24, 2017.
(Continued)

*Primary Examiner* — Jarrett J Stark
(74) *Attorney, Agent, or Firm* — STUDEBAKER & BRACKETT PC

(57) ABSTRACT

In a method of manufacturing a semiconductor device, first and second gate structures are formed. The first (second) gate structure includes a first (second) gate electrode layer and first (second) sidewall spacers disposed on both side faces of the first (second) gate electrode layer. The first and second gate electrode layers are recessed and the first and second sidewall spacers are recessed, thereby forming a first space and a second space over the recessed first and second gate electrode layers and first and second sidewall spacers, respectively. First and second protective layers are formed in the first and second spaces, respectively. First and second etch-stop layers are formed on the first and second protective layers, respectively. A first depth of the first space above the first sidewall spacers is different from a second depth of the first space above the first gate electrode layer.

20 Claims, 10 Drawing Sheets

Related U.S. Application Data continuation of application No. 15/870,649, filed on Jan. 12, 2018, now Pat. No. 10,797,048, which is a division of application No. 15/141,476, filed on Apr. 28, 2016, now Pat. No. 9,893,062.

(51) Int. Cl.

| | | |
|---|---|---|
| *H01L 21/8234* | (2006.01) | |
| *H01L 21/8238* | (2006.01) | |
| *H01L 29/08* | (2006.01) | |
| *H01L 29/66* | (2006.01) | |
| *H01L 29/49* | (2006.01) | |
| *H01L 29/51* | (2006.01) | |

(52) U.S. Cl.
CPC ............... *H01L 21/823431* (2013.01); *H01L 21/823437* (2013.01); *H01L 21/823475* (2013.01); *H01L 21/823821* (2013.01); *H01L 29/0847* (2013.01); *H01L 29/66636* (2013.01); H01L 21/76832 (2013.01); H01L 21/76834 (2013.01); H01L 21/823468 (2013.01); H01L 29/4958 (2013.01); H01L 29/4966 (2013.01); H01L 29/4975 (2013.01); H01L 29/517 (2013.01)

(58) Field of Classification Search
CPC ....... H01L 21/823431; H01L 21/76897; H01L 29/0847; H01L 21/823475; H01L 29/66636; H01L 21/76834; H01L 21/76832; H01L 29/4975; H01L 29/517; H01L 29/4966; H01L 29/4958
See application file for complete search history.

(56) References Cited

U.S. PATENT DOCUMENTS

| | | | |
|---|---|---|---|
| 6,736,056 B1 | 5/2004 | Marek et al. | |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Llaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,257,348 B2 | 2/2016 | Xie et al. | |
| 9,287,362 B1 | 3/2016 | Basu et al. | |
| 9,306,032 B2 | 4/2016 | Lin et al. | |
| 9,318,336 B2 | 4/2016 | Breil et al. | |
| 9,450,099 B1 | 9/2016 | Chang et al. | |
| 9,508,825 B1 | 11/2016 | Basker et al. | |
| 9,601,387 B2 | 3/2017 | Cai et al. | |
| 9,607,892 B2 | 3/2017 | Liou et al. | |
| 10,211,103 B1 | 2/2019 | Huang et al. | |
| 2002/0135010 A1 | 9/2002 | Sheu et al. | |
| 2003/0100172 A1 | 5/2003 | Kim et al. | |
| 2005/0106887 A1 | 5/2005 | Chen et al. | |
| 2005/0236694 A1 | 10/2005 | Wu et al. | |
| 2010/0224936 A1 | 9/2010 | Hokazono | |
| 2012/0280251 A1 | 11/2012 | Dube et al. | |
| 2014/0001574 A1 | 1/2014 | Chen et al. | |
| 2014/0035010 A1* | 2/2014 | Cai | H01L 29/66545 257/288 |
| 2014/0110755 A1 | 4/2014 | Colinge | |
| 2014/0151812 A1 | 6/2014 | Liaw | |
| 2014/0197468 A1 | 7/2014 | Xie et al. | |
| 2014/0284671 A1 | 9/2014 | Hung et al. | |
| 2015/0318178 A1 | 11/2015 | Pham et al. | |
| 2015/0364326 A1 | 12/2015 | Xie et al. | |
| 2015/0364371 A1* | 12/2015 | Yen | H01L 21/7685 438/666 |
| 2016/0027901 A1 | 1/2016 | Park et al. | |
| 2016/0035857 A1* | 2/2016 | Leobandung | H01L 29/66545 257/288 |
| 2016/0043186 A1 | 2/2016 | Liu et al. | |
| 2016/0056262 A1* | 2/2016 | Ho | H01L 21/47635 257/288 |
| 2016/0163815 A1 | 6/2016 | Hoentschel et al. | |
| 2016/0240624 A1 | 8/2016 | Zhu | |
| 2016/0260833 A1 | 9/2016 | Basker et al. | |
| 2016/0284641 A1* | 9/2016 | Liou | H01L 23/5226 |
| 2016/0308012 A1 | 10/2016 | Song et al. | |
| 2016/0308016 A1 | 10/2016 | Choi et al. | |
| 2016/0315045 A1 | 10/2016 | Baek et al. | |
| 2016/0315171 A1 | 10/2016 | Hung et al. | |
| 2016/0322471 A1 | 11/2016 | JangJian et al. | |
| 2016/0336420 A1 | 11/2016 | Chou et al. | |
| 2016/0336426 A1 | 11/2016 | Chang et al. | |
| 2016/0343660 A1 | 11/2016 | Kim et al. | |
| 2016/0343827 A1 | 11/2016 | Wu et al. | |
| 2016/0351687 A1 | 12/2016 | Costrini et al. | |
| 2016/0365449 A1 | 12/2016 | Chang et al. | |
| 2017/0179119 A1 | 6/2017 | Chang et al. | |
| 2017/0186849 A1* | 6/2017 | Chen | H01L 21/76883 |
| 2017/0317076 A1 | 11/2017 | Shen et al. | |
| 2018/0175171 A1 | 6/2018 | Lo et al. | |
| 2018/0211874 A1* | 7/2018 | Basker | H01L 29/66795 |
| 2018/0248013 A1 | 8/2018 | Chowdhury et al. | |
| 2018/0261596 A1 | 9/2018 | Jun et al. | |
| 2019/0228976 A1 | 7/2019 | Huang et al. | |
| 2019/0326416 A1 | 10/2019 | Huang et al. | |

OTHER PUBLICATIONS

Non-Final Action issued in U.S. Appl. No. 15/141,476, dated Dec. 28, 2016.
Notice of Allowance issued in U.S. Appl. No. 15/141,476, dated Oct. 6, 2017.
Non-Final Office Action issued in related U.S. Appl. No. 15/870,649, dated Nov. 15, 2018.
Final Office Action issued in related U.S. Appl. No. 15/870,649, dated Mar. 14, 2019.
Non-Final Office Action issued in related U.S. Appl. No. 15/870,649, dated Nov. 4, 2019.
Final Office Action issued in related U.S. Appl. No. 15/870,649, dated May 28, 2019.
Final Office Action issued in related U.S. Appl. No. 15/870,649, dated Feb. 14, 2020.
Notice of Allowance ssued in related U.S. Appl. No. 15/870,649, dated Jun. 4, 2020.
Non-Final Office Action Issued in related U.S. Appl. No. 17/063,243, dated Apr. 8, 2022.
Notice of Allowance issued in related U.S. Appl. No. 17/063,243, dated Jul. 22, 2022.

\* cited by examiner

SEMICONDUCTOR DEVICE AND A METHOD FOR FABRICATING THE SAME

RELATED APPLICATIONS

This application is a continuation of U.S. patent application Ser. No. 17/063,243 filed Oct. 5, 2020, now U.S. Pat. No. 11,521,970, which a continuation of U.S. application Ser. No. 15/870,649 filed Jan. 12, 2018, now U.S. Pat. No. 10,797,048, which is a divisional of U.S. application Ser. No. 15/141,476, filed Apr. 28, 2016, now U.S. Pat. No. 9,893,062, the entire content of each of which is incorporated herein by reference.

TECHNICAL FIELD

The disclosure relates to a method for manufacturing a semiconductor device, and more particularly to a structure and a manufacturing method for insulating layers over a gate electrode and source/drain regions.

BACKGROUND

With a decrease of dimensions of semiconductor devices, a self-aligned contact (SAC) has been widely utilized for fabricating, e.g., source/drain (S/D) contacts arranged closer to gate structures in a field effect transistor (FET). Typically, a SAC is fabricated by patterning an interlayer dielectric (ILD) layer, under which a contact etch-stop layer (CESL) is formed over the gate structure having sidewall spacers. The initial etching of the ILD layer stops at the CESL, and then the CESL is etched to form the SAC. As the device density increases (i.e., the dimensions of semiconductor device decreases), the thickness of the sidewall spacer becomes thinner, which may cause a short circuit between the S/D contact and the gate electrodes. Accordingly, it has been required to provide SAC structures and manufacturing process with improved electrical isolation between the S/D contacts and gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
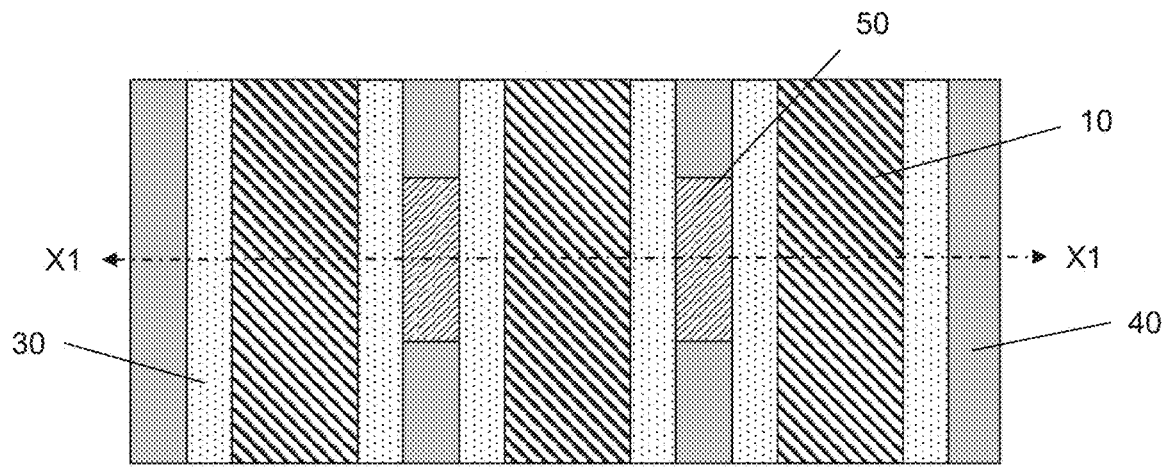
FIG. 1A shows an exemplary plan view (viewed from the above) illustrating one of the various stages of a sequential fabrication process of a semiconductor device according to one embodiment of the present disclosure.
Figure 1B:
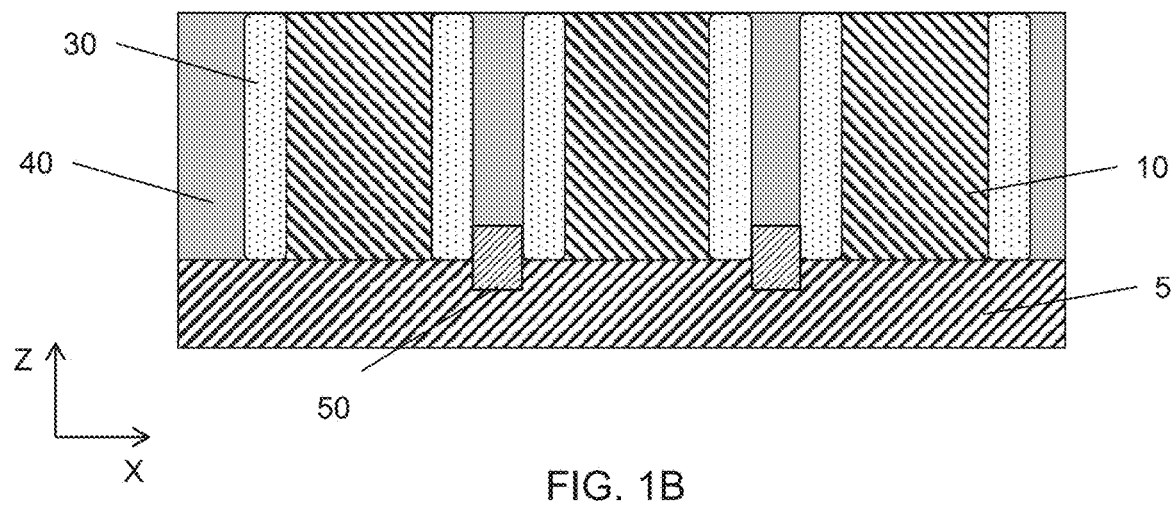
FIG. 1B shows an exemplary cross sectional view along line X1-X1 of FIG. 1A.

FIGS. 1A and 1B show one of the stages of a sequential fabrication process of a semiconductor device according to one embodiment of the present disclosure. FIG. 1A shows a plan (top) view and FIG. 1B shows a cross sectional view along line X1-X1 of FIG. 1A.

FIGS. 1A and 1B show a structure of a semiconductor device after metal gate structures are formed. In FIGS. 1A and 1B, metal gate structures 10 are formed over a channel layer 5, for example, a part of a fin structure. The thickness of the metal gate structures 10 is in a range from 15 nm to 50 nm in some embodiments. Sidewall spacers 30 are provided on sidewalls of the metal gate structure 10. The film thickness of the sidewall spacers 30 at the bottom of the sidewall spacers is in a range from about 3 nm to about 15 nm in some embodiments, and is in a range from about 4 nm to about 10 nm in other embodiments. The combination of the metal gate structure 10 and sidewall spacers 30 may be collectively referred to as a gate structure. Further, source/drain regions 50 are formed adjacent to or between the gate structures, and spaces between the gate structures are filled with a first interlayer dielectric (ILD) layer 40. In this disclosure, a source and a gate are interchangeably used, and source/drain (or S/D) may refer to one of or both of the source and drain.

Figure 1C:
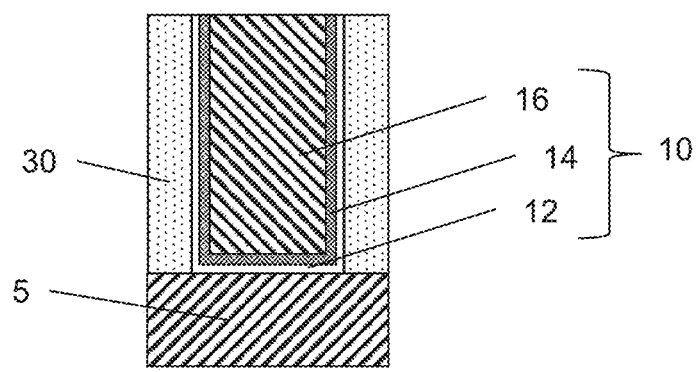
FIG. 1C is an enlarged view of the gate structure.

FIG. 1C is an enlarged view of the gate structure. The metal gate structure 10 includes one or more layers 16 of metal material, such as Al, Cu, W, Ti, Ta, TiN, TiAl, TiAlC, TiAlN, TaN, NiSi, CoSi, other conductive materials. A gate dielectric layer 12 disposed between the channel layer 5 and the metal gate includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The sidewall spacers 30 include one or more layers of insulating material such as a silicon oxide based material or a silicon nitride based material, including $SiO_2$, SiN, SiON, SiCN and SiOCN. The first ILD layer 40 includes one or more layers of insulating material such as silicon oxide based material such as silicon dioxide ($SiO_2$) and SiON.

The material of the sidewall spacers 30 and the material of the first ILD layer 40 are different from each other, so that each of these layers can be selectively etched. In one embodiment, the sidewall spacer 30 is made of SiOCN, SiCN or SiON and the first ILD 40 layer is made of $SiO_2$.

In this embodiment, fin field effect transistors (Fin FETs) fabricated by a gate-replacement process are employed.

Figure 1D:
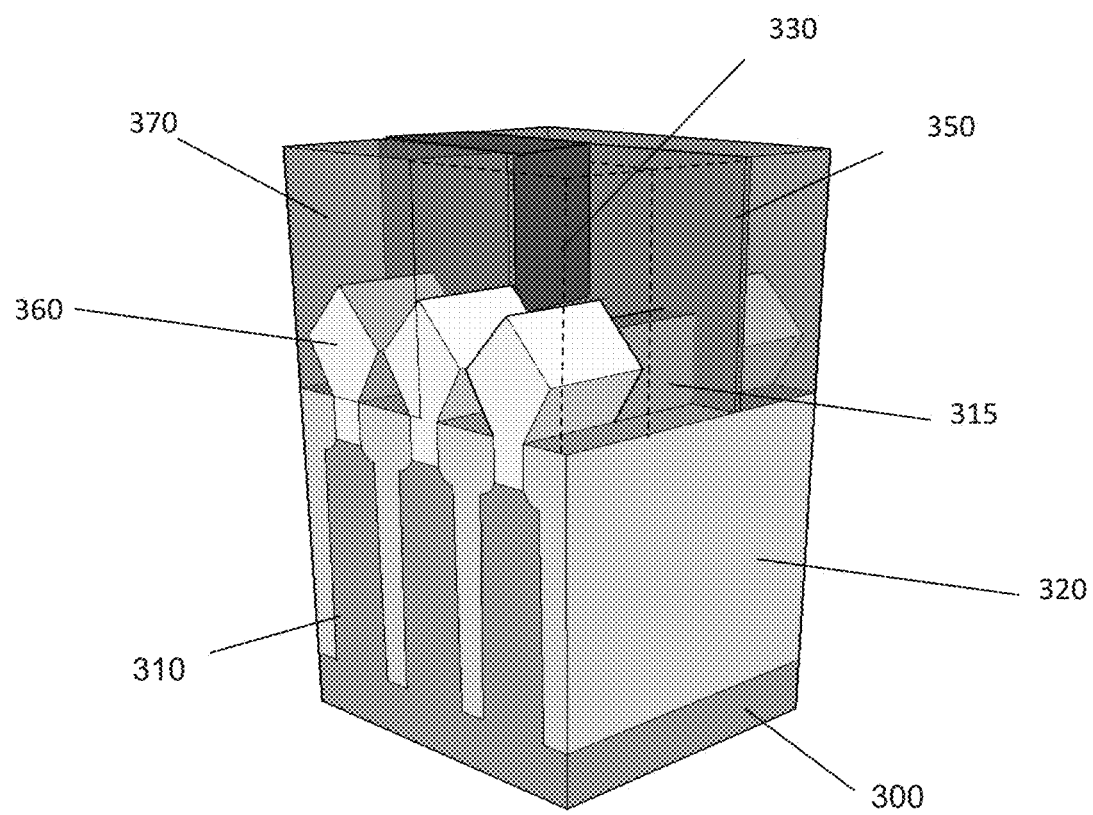
FIG. 1D shows an exemplary perspective view illustrating one of the various stages of a sequential fabrication process of a semiconductor device according to one embodiment of the present disclosure.

FIG. 1D shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric (ILD) layer 370 is formed over the dummy gate structure and the source/drain region. After a planarization operation, the dummy gate structure is removed so as to make a gate space. Then, in the gate space, a metal gate structure 330 including a metal gate electrode and a gate dielectric layer, such as a high-k dielectric layer, is formed, so as to obtain the Fin FET structure shown in FIG. 1D. In FIG. 1D, parts of the metal gate structure 330, sidewalls 330 and the ILD layer 370 are cut to show the underlying structure.

The metal gate structure 330, sidewalls 330, source/drain 360 and the ILD layer 370 of FIG. 1D substantially correspond to the metal gate structures 10, sidewall spacers 30, source/drain regions 50 and first ILD layer 40, of FIGS. 1A and 1B, respectively.

FIGS. 2-16 show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-16, and some of the operations described below can be replaced or eliminated, for additional embodiments of the method. The order of the operations/processes may be interchangeable.

Figure 2:
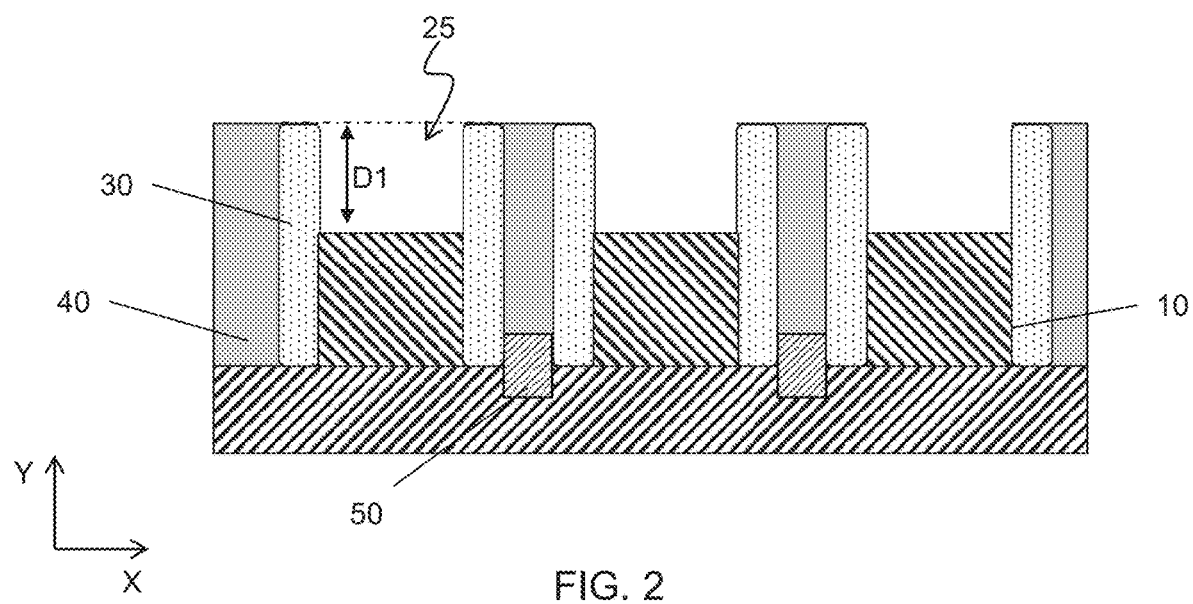
FIGS. 2-16 show exemplary cross sectional views corresponding to line X1-X1 of FIG. 1A illustrating various stages of the sequential fabrication process of a semiconductor device according to one embodiment of the present disclosure.

As shown in FIG. 2, the gate electrode layer 10 is recessed by using a dry and/or a wet etching process. The depth D1 above the gate electrode 10 of the recessed space 25 measured from the upper surface of the first ILD layer 40 is in a range from about 10 nm to about 25 nm in some embodiments, and is in a range from about 15 nm to about 20 nm in other embodiments.

Figure 3:
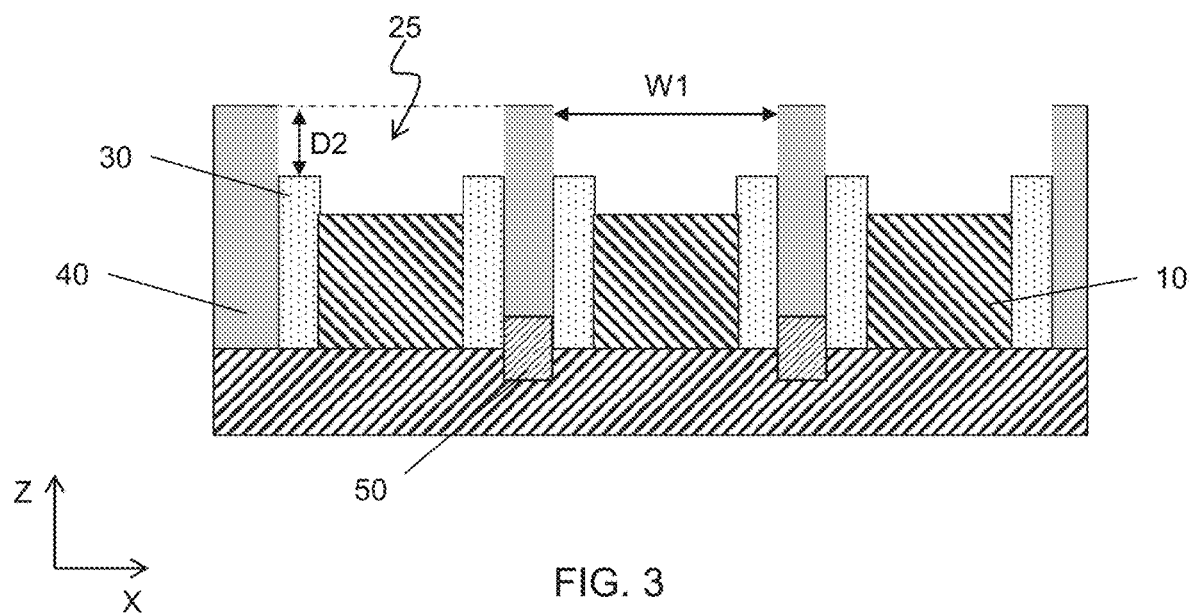

As shown in FIG. 3, the sidewall spacers 30 are recessed by using a dry and/or a wet etching process to broaden the recessed space 25. Since the sidewall spacers 30 are made of a material different from the first ILD layer 40, the sidewall spacer layers 30 can be substantially selectively etched. The depth D2 above the sidewall spacers 30 of the recessed space 25 measured from the upper surface of the first ILD layer 40 is in a range from about 5 nm to about 20 nm in some embodiments, and is in a range from about 8 nm to about 15 nm in other embodiments.

The depth D2 is different from the depth D1. In some embodiments, the depth D2 is smaller than the depth D1. In other words, in FIG. 3, the top of the sidewall spacers 30 is higher than the top of the gate electrode 10. The difference between the depth D2 and the depth D1 (i.e., the difference in heights of the sidewall spacers 30 and the gate electrode 10) is in a range from about 5 nm to about 15 nm in some embodiments, and is in a range from about 8 nm to about 12 nm in other embodiments.

It is noted that the gate electrode layer 10 may be recessed after the sidewall spacers 30 are recessed.

Figure 4:
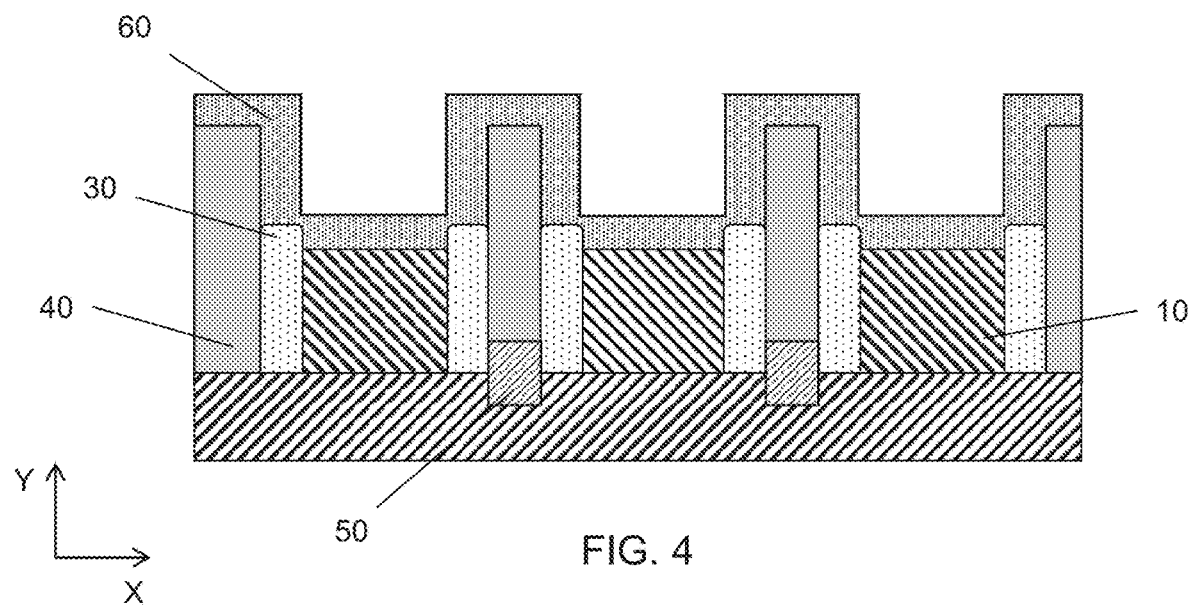
Figure 5:
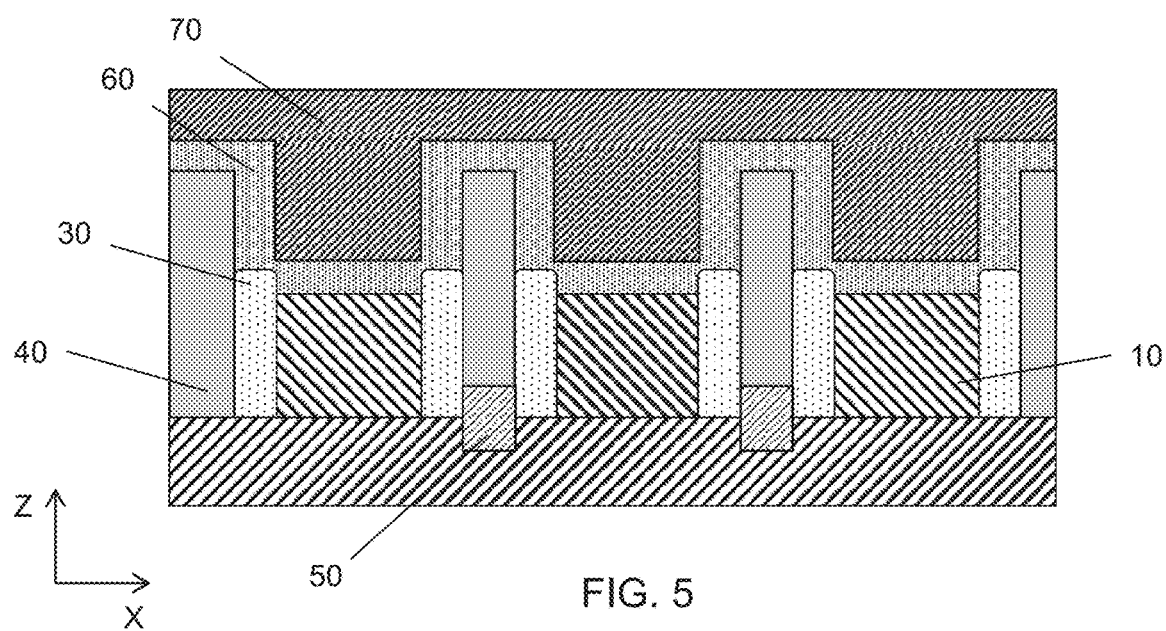

Then, a protective layer 60 is conformally formed in the recessed space 25, as shown in FIG. 4. The protective layer 60 protects the sidewall spacers 30 from subsequent etching operations. Further, the protective layer 60 disposed above the gate electrode 10 functions as a cap insulating layer in the gate structure. One or more blanket layers of insulating material are conformally formed over the structure shown in FIG. 3. As shown in FIG. 3, the protective layer 60 partially fills the space 25. The thickness of the protective layer 60 is in a range from about 3 nm to about 5 nm in some embodiments.

Figure 6:
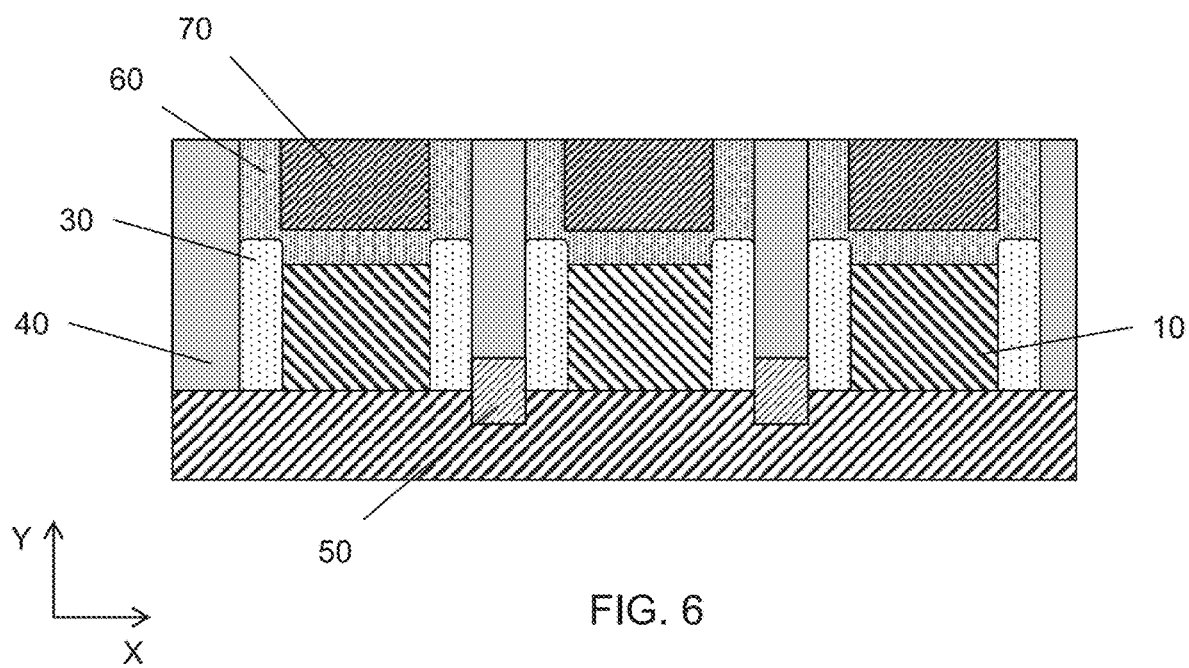

After the protective layer 60 is formed, a first etch-stop layer (ESL) 70 is formed on the protective layer 60. One or more blanket layers of insulating material are formed on the protective layer 60. Then, a planarization operation, such as an etch-back process and/or a chemical mechanical polishing (CMP) process, is performed to remove the upper portions of the protective layer 60 and the first ESL 70, as shown in FIG. 6.

After the planarization operation, the first ESL 70 is in a range from about 40 nm to about 50 nm in some embodiments, and is in a range from about 20 nm to about 30 nm in other embodiments.

The protective layer 60 and the first ESL 70 are made of different insulating materials. The protective layer 60 is made of a material which has a high etching resistivity against silicon based insulating materials. In some embodiments, an aluminum based insulating material, such as AlO, AlON and/or AlN, is used as the protective layer 60, and a silicon nitride based material, such as SiN and/or SiON, is used as the first ESL 70. The first ESL 70 disposed above the gate electrode 10 functions as another cap insulating layer in the gate structure.

Figure 7:
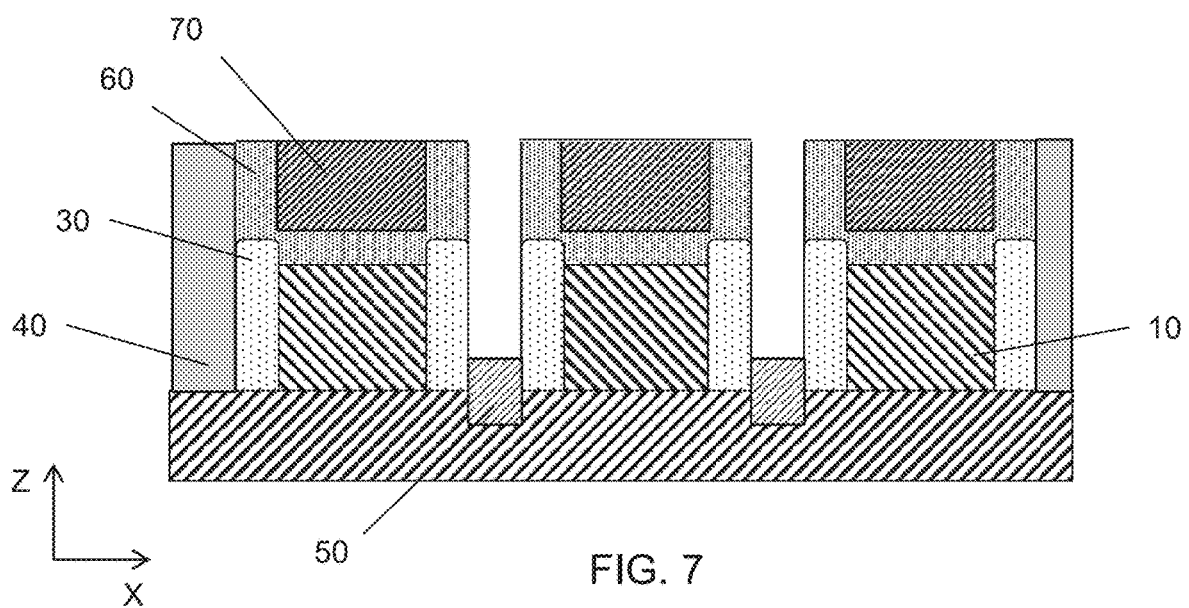
Figure 8:
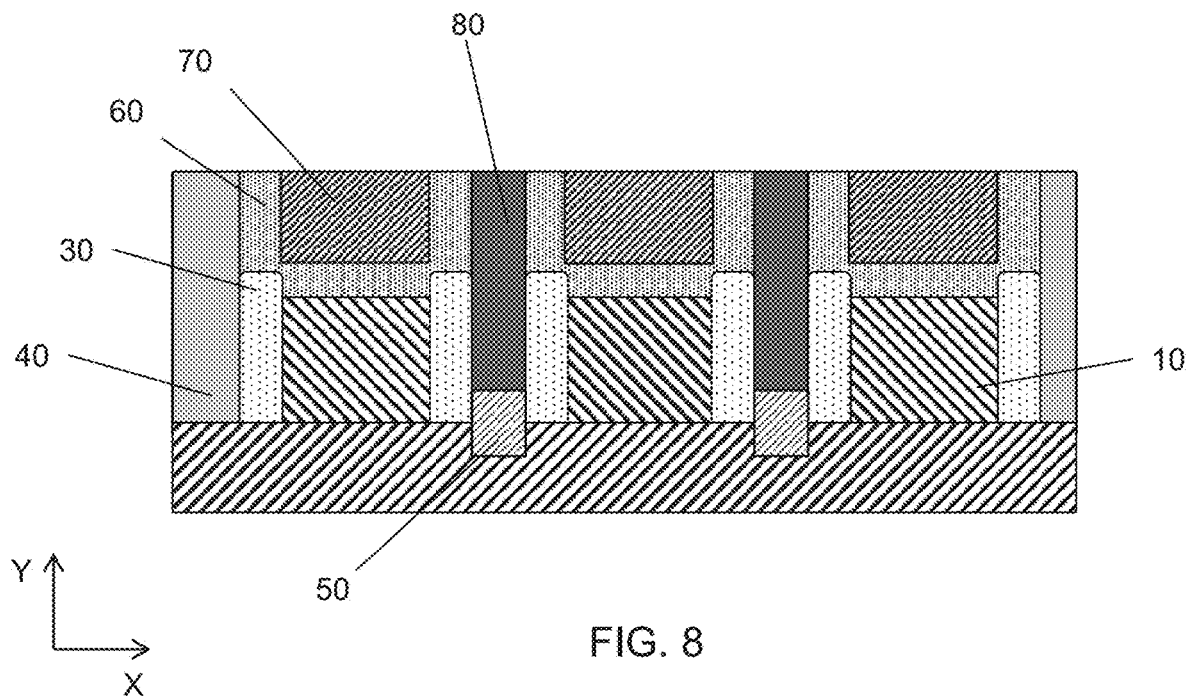

After the planarization operation, the first ILD layer 40 disposed over the source/drain structures 50 is removed, as shown in FIG. 7 by using a suitable etching operation.

Subsequently, a conductive material is formed over the structure of FIG. 7. One or more layers of conductive material, such as tungsten, titanium, cobalt, tantalum, copper, aluminum or nickel, or silicide thereof, or other suitable materials, are formed over the structure of FIG. 7. Then, a planarization operation, such as a CMP process, is performed, so as to obtain the structure of FIG. 8. The space between two gate structures is filled by the conductive material, thereby forming a source/drain contact layer 80 in contact with the source/drain region 50.

Figure 9:
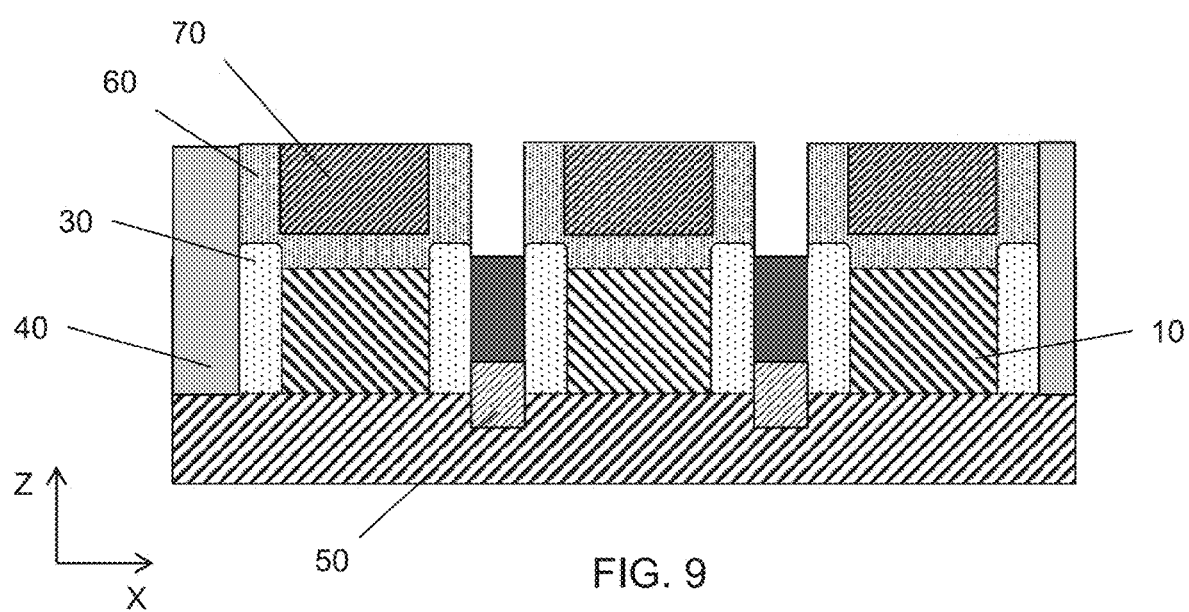

Then, as shown in FIG. 9, the source/drain contact layer 80 is recessed by using a suitable etching operation. The spaces formed by recessing the source/drain contact layer 80 is filled with an insulating material, thereby forming a second ESL 90, as shown in FIG. 10.

The second ESL 90 includes one or more layers of a silicon carbide based insulating material, such as SiC and/or SiOC. A blanket layer of the insulating material is formed over the structure of FIG. 9, and then a planarization operation, such as CMP, is performed, thereby obtaining the structure of FIG. 10.

Figure 10:
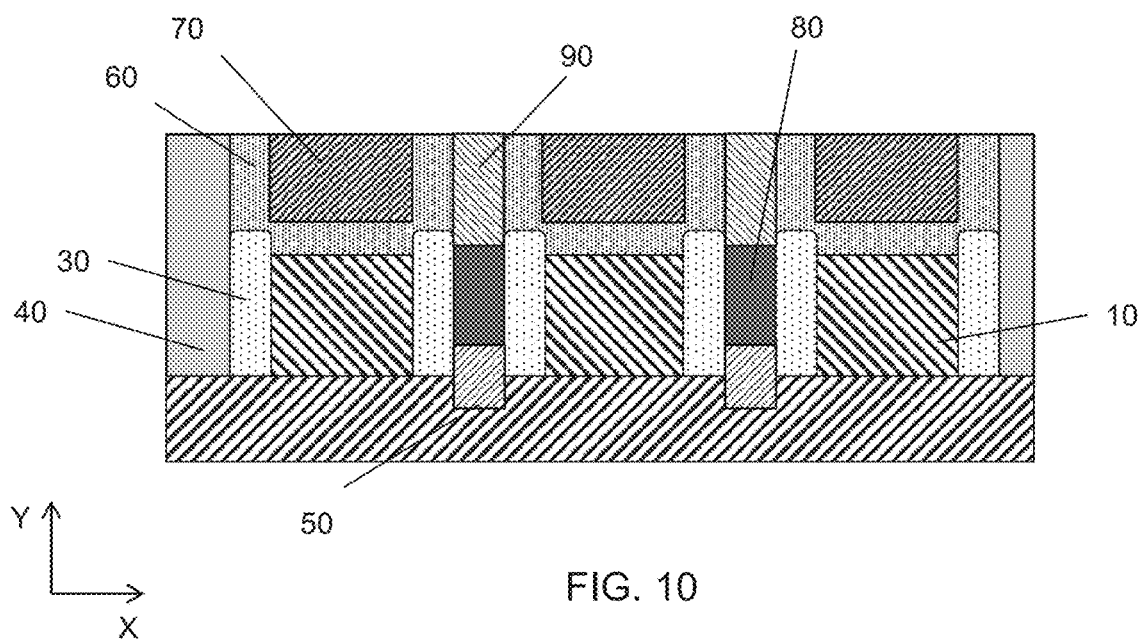
Figure 11:
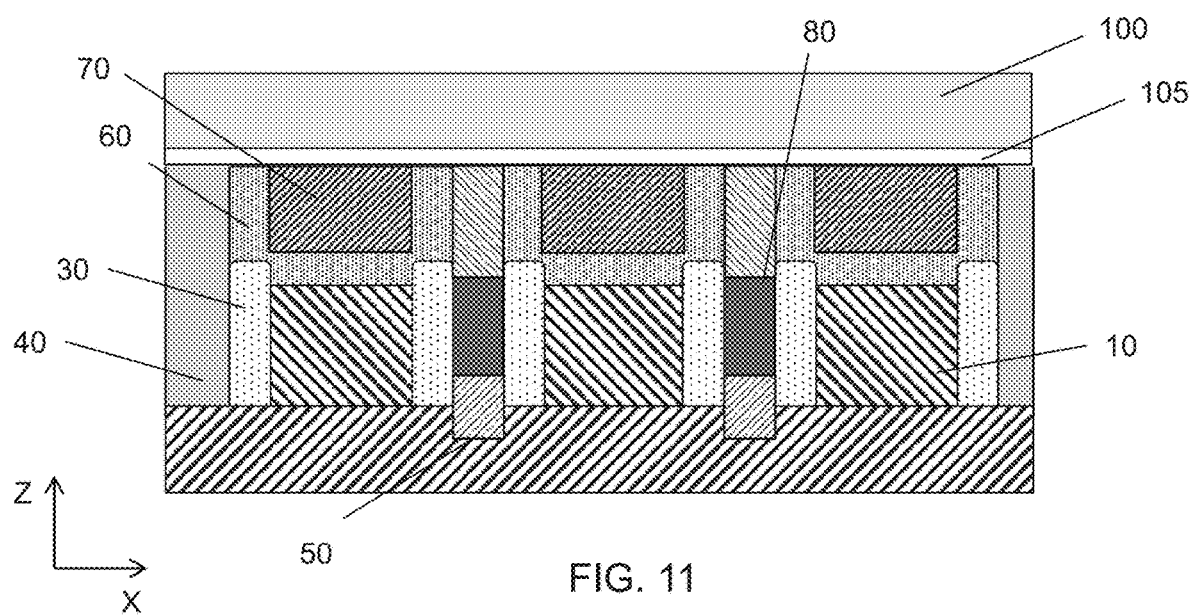

Further, as shown in FIG. 11, a second ILD 100 is formed over the structure of FIG. 10. The second ILD layer 100 includes one or more layers of insulating material including a silicon oxide based material, such as silicon dioxide ($SiO_2$) and SiON, or a low-k dielectric material. In some embodiments, a third ESL 105 made of, for example, SiN, SiON and/or SiOCN, is formed before forming the second ILD layer 100.

Figure 12:
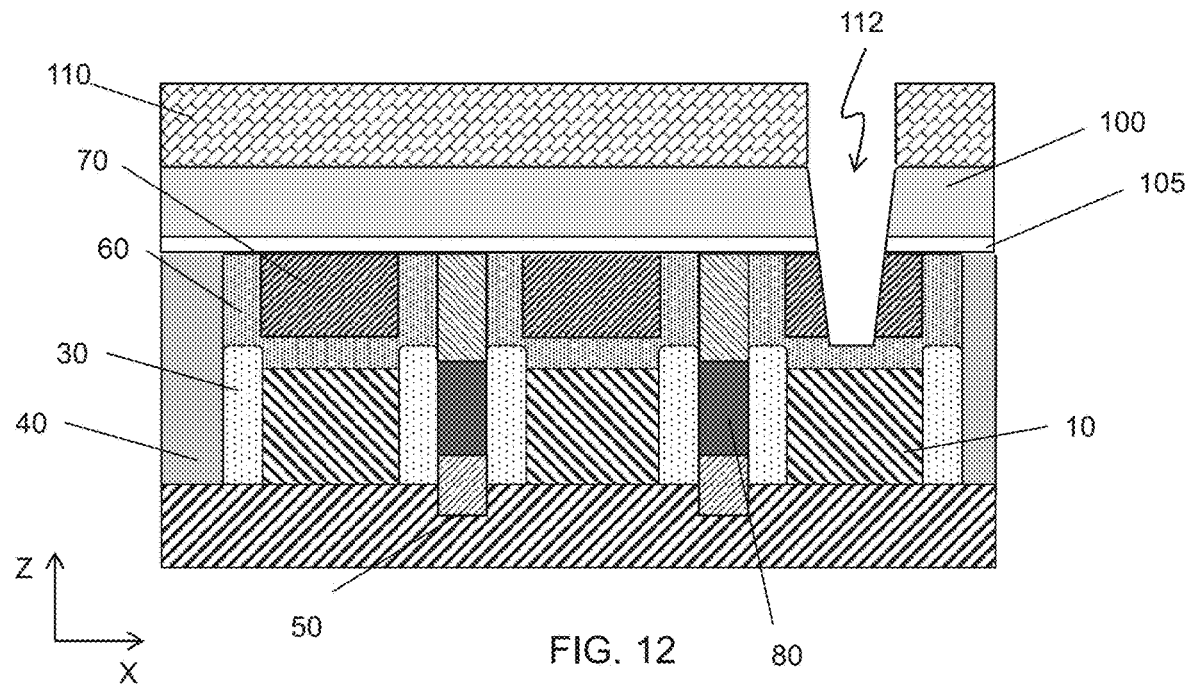

After forming the second ILD layer 100, a first mask pattern 110 having an opening above the gate electrode 10 is formed over the second ILD layer 100. By using the first mask pattern 110 as an etching mask, the second ILD layer 100, the third ESL 105 and the first ESL 70 are etched to form a contact hole 112, using an etching operation, as shown in FIG. 12. In this etching operation, the protective layer 60 formed on the gate electrode 10 functions as an etching-stop layer, and the etching of the first ESL 70 substantially stops at the protective layer 60. The first mask pattern 110 includes at least one of a resist pattern and a hard mask pattern. The hard mask pattern may include one or more layers of dielectric material, metal nitride, such as TiN or TaN, or metal oxide, such as $TiO_2$.

Figure 13:
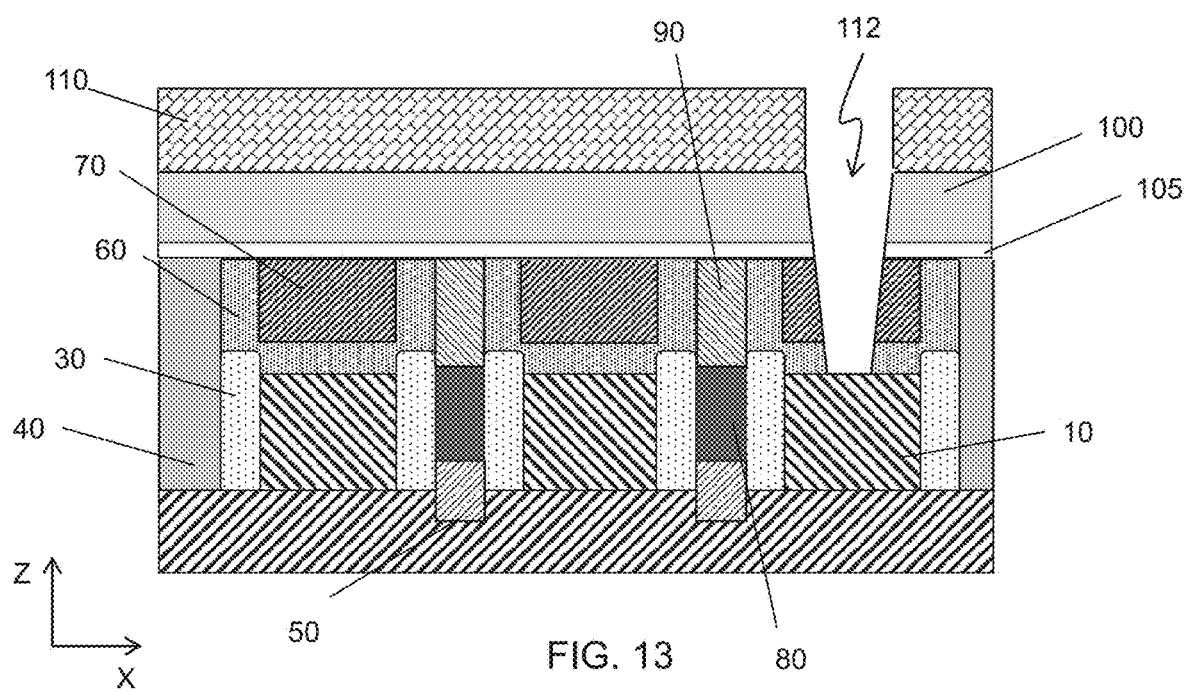

Subsequently, the protective layer 60 is further etched to complete the forming of the contact hole 112, as shown in FIG. 13. The etching of the protective layer 60 includes a wet etching process in some embodiments. Then, the first mask pattern 110 is removed. In some embodiments, the first mask pattern 110 is removed before the etching of the protective layer 60.

Figure 14:
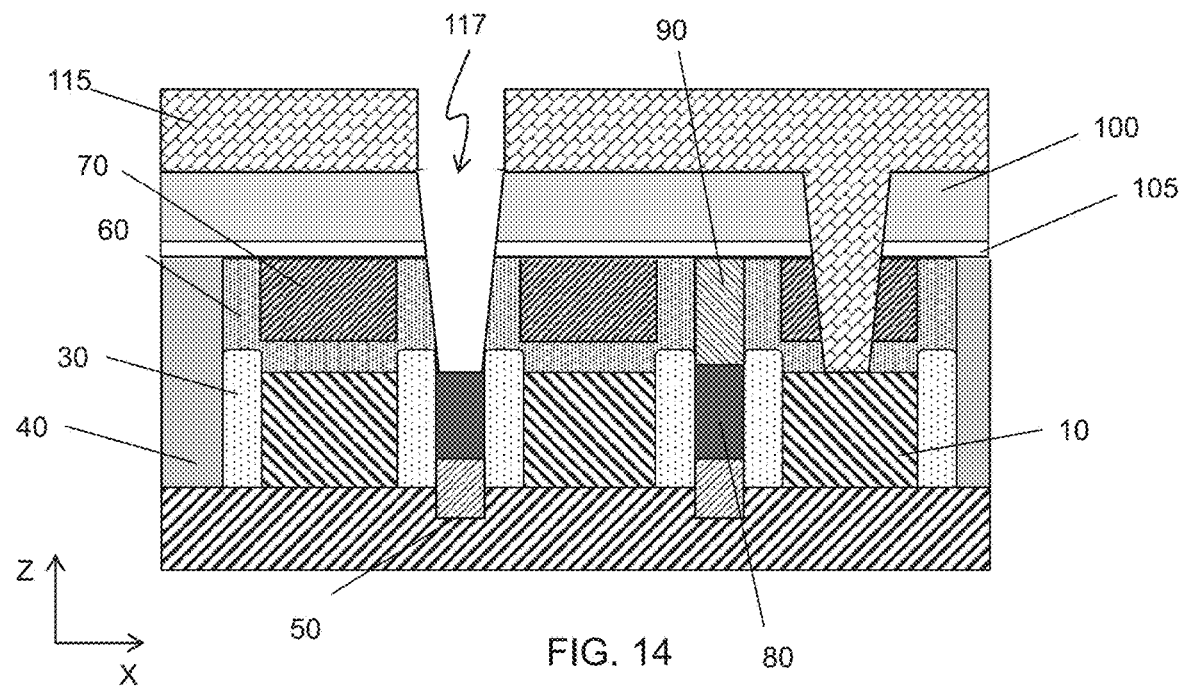
Figure 15:
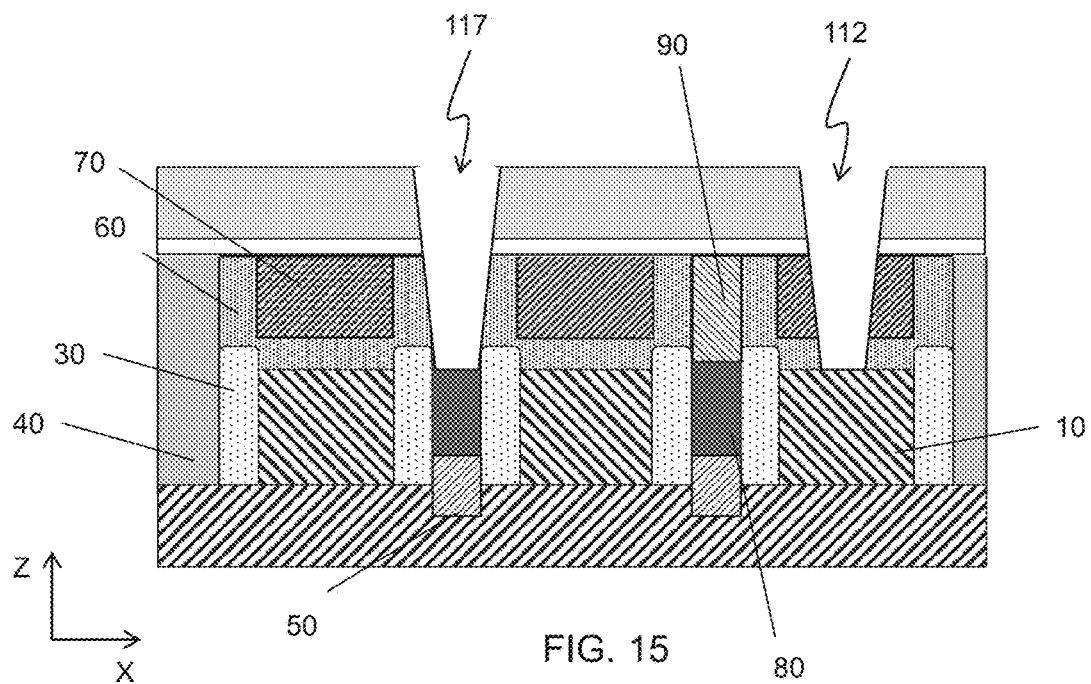

As shown in FIG. 14, a second mask pattern 115 having an opening above the source/drain contact layer 80 is formed over the second ILD layer 100. By using the second mask pattern 115 as an etching mask, the second ILD layer 100, the third ESL 105 and the second ESL 90 are etched to form a contact hole 117, using an etching operation, as shown in FIG. 14. In this etching operation, the protective layer 60 (and the sidewall spaces 30) is not substantially etched, thus the contact hole 117 can be formed in a self-aligned manner. The second mask pattern 115 includes at least one of a resist pattern and a hard mask pattern. The hard mask pattern may include one or more layers of dielectric material, metal nitride, such as TiN or TaN, or metal oxide, such as $TiO_2$. Then, the second mask pattern 115 is removed, as shown in FIG. 15. In some embodiments, the second mask pattern 115 is removed during the etching of the second ESL 90.

In some embodiments, the contact hole 112 is formed after the contact hole 117 is formed.

Figure 16:
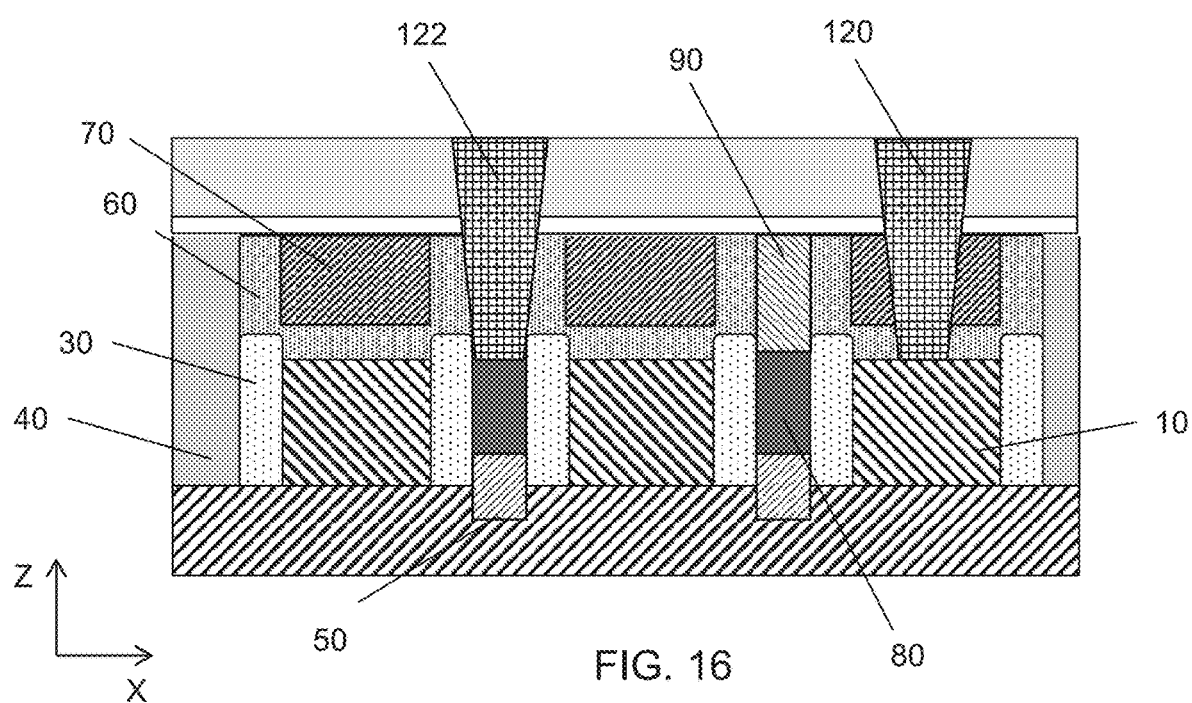

The contact holes 112 and 117 are then filed with one or more conductive materials so as to form via plugs 120 and 122, as shown in FIG. 16. A blanket layer of conductive material is formed over the structure of FIG. 15, and then a planarization operation, such as CMP, is performed.

It is understood that the device shown in FIG. 16 undergoes further CMOS processes to form various features such as interconnect metal layers, dielectric layers, passivation layers, etc.

The various embodiments or examples described herein offer several advantages over the existing art. For example, in the present disclosure, it is possible to form two cap layers over the gate electrode with simplified manufacturing operations, and the two cap layers are used as contact-etch stop layers. Further, one of the two cap layers is also used as a protective layer for the sidewall spacers, which also simplifies the manufacturing operations. By using different materials for the protective layer, the first etch-stop layers (cap layers) and the second etch-stop layer, it is possible to gain an etching selectivity during a contact hole etching operation.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a first gate structure and a second gate structure are formed over a substrate. The first gate structure includes a first gate electrode layer and first sidewall spacers disposed on both side faces of the first gate electrode layer, and the second gate structure includes a second gate electrode layer and second sidewall spacers disposed on both side faces of the second gate electrode layer. A first insulating layer is formed between the first gate structure and the second gate structure. After the first insulating layer is formed, the first and second gate electrode layers are recessed, and the first and second sidewall spacers are recessed, thereby forming a first space over the recessed first gate electrode layer and the recessed first sidewall spacers and a second space over the recessed second gate electrode layer and the recessed second sidewall spacers. A first protective layer is conformally formed in the first space and a second protective layer is conformally formed in the second space. A first etch-stop layer is formed on the first protective layer and a second etch-stop layer is formed on the second protective layer. A first depth of the first space above the first side wall spacers is different from a second depth of the first space above the first gate electrode layer.

According to another aspect of the present disclosure, in a method of manufacturing a semiconductor device, a first gate structure and a second gate structure are formed over a substrate. The first gate structure includes a first gate electrode layer and first sidewall spacers disposed on both side faces of the first gate electrode layer, and the second gate structure includes a second gate electrode layer and second sidewall spacers disposed on both side faces of the second gate electrode layer. A first source/drain region is formed in an area between the first gate structure and the second gate structure. A first insulating layer is formed over the first source/drain region and between the first gate structure and the second gate structure. After the first insulating layer is formed, the first and second gate electrode layers are recessed, and the first and second sidewall spacers are recessed, thereby forming a first space over the recessed first gate electrode layer and the recessed first sidewall spacers and a second space over the recessed gate electrode layer and the recessed second sidewall spacers. A first protective layer is conformally formed in the first space and a second protective layer is conformally formed in the second space. A first etch-stop layer is formed on the first protective layer and a second etch-stop layer is formed on the second protective layer. The first insulating layer disposed over the first source/drain region is removed, thereby forming a source/drain space. The source/drain space is filled with a conductive material. The filled conductive material is recessed, thereby forming a source/drain contact layer. A third etch-stop layer is formed over the source/drain contact layer.

In accordance with yet another aspect of the present disclosure, a semiconductor device includes a gate structure. The gate structure include a gate electrode layer, a first cap insulating layer disposed over the gate electrode layer, a second cap insulating layer disposed over the first cap insulating layer, and first sidewall spacers disposed on both side faces of the gate electrode layer. The first cap insulating layer extends over and is disposed on the first sidewall spacers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a gate structure disposed over a channel region, the gate structure including a gate electrode layer, first sidewall spacers, second sidewall spacers disposed on tops of the first sidewall spacers, and first and second cap insulating layers disposed over the gate electrode layer;
 a first dielectric layer in which the gate structure is embedded;
 a second dielectric layer disposed over the first dielectric layer; and
 a third dielectric layer disposed over the second dielectric layer,
 wherein the second sidewall spacers and an uppermost layer of the second cap insulating layer are in contact with the second dielectric layer,
 wherein the first cap insulating layer and the second sidewall spacers continuously form a U-shape cross section, and
 uppermost surfaces of the first sidewall spacers extend above a lowermost surface of the first cap insulating layer, and the uppermost surfaces of the first sidewall spacers extend below an uppermost surface of the first cap insulating layer.

2. The semiconductor device of claim 1, wherein the first cap insulating layer is in contact with the gate electrode layer and the second cap insulating layer is disposed over the first cap insulating layer.

3. The semiconductor device of claim 2, wherein the first cap insulating layer and the second sidewall spacers are made of a same material.

4. The semiconductor device of claim 2 wherein the second cap insulating layer is in contact with the second dielectric layer.

5. The semiconductor device of claim 2, further comprising:
 a source/drain epitaxial layer disposed adjacent to the gate structure;
 a source/drain conductive plug disposed on the source/drain epitaxial layer; and
 a source/drain cap insulating layer disposed on the source/drain conductive plug.

6. The semiconductor device of claim 5, wherein:
 a side surface of the source/drain conductive plug contacts a side surface of one of the first sidewall spacers, and
 the source/drain cap insulating plug is in contact with the side surface of the one of the first sidewall spacers and a side surface of one of the second sidewall spacers.

7. The semiconductor device of claim 2, further comprising a gate contact contacting the gate electrode layer passing through the second cap insulating layer and the first cap insulating layer.

8. The semiconductor device of claim 2, wherein the second dielectric layer includes at least one selected the group consisting of SiN, SiON and SiOCN.

9. A semiconductor device, comprising:
 a first gate structure and a second gate structure, both disposed over a fin structure,
 a first dielectric layer in which the first and second gate structures are embedded;
 a second dielectric layer disposed over the first dielectric layer; and
 a third dielectric layer disposed over the second dielectric layer, wherein:
 each of the first and second gate structures includes a gate electrode layer, first sidewall spacers, second sidewall spacers disposed on tops of the first sidewall spacers, and first and second cap insulating layers disposed over the gate electrode layer,
 the second sidewall spacers and an uppermost layer of the second cap insulating layer of each of the first and second gate structures are in contact with the second dielectric layer,
 in each of the first and second gate structures, the first cap insulating layer and the second sidewall spacers are continuously formed, and
 uppermost surfaces of the first sidewall spacers extend above a lowermost surface of the first cap insulating layer, and the uppermost surfaces of the first sidewall spacers extend below an uppermost surface of the first cap insulating layer.

10. The semiconductor device of claim 9, wherein in each of the first and second gate structures, the first cap insulating layer is in contact with the gate electrode layer and the second cap insulating layer is disposed over the first cap insulating layer.

11. The semiconductor device of claim 10, further comprising:
a source/drain epitaxial layer disposed between the first and second gate structures and protruding from the fin structure;
a source/drain conductive plug disposed on the source/drain epitaxial layer; and
a source/drain cap insulating plug disposed on the source/drain conductive plug.

12. The semiconductor device of claim 11, wherein the source/drain cap insulating plug is in contact with a side surface of one of the first sidewall spacers of the first gate structure and one of the first sidewall spacers of the second gate structure.

13. The semiconductor device of claim 10, wherein the first cap insulating layer is made of a different material than the second cap insulating layer.

14. The semiconductor device of claim 13, wherein the first cap insulating layer is made of an aluminum based insulating material.

15. The semiconductor device of claim 13, wherein the second cap insulating layer is made of a silicon nitride based insulating material.

16. A semiconductor device, comprising:
a first gate structure and a second gate structure, both disposed over a fin structure, wherein each of the first and second gate structures includes a gate electrode layer, first sidewall spacers, second sidewall spacers disposed on tops of the first sidewall spacers, a first cap insulating layer disposed on the gate electrode layer and a second cap insulating layer disposed on the first cap insulating layer;
a first dielectric layer in which the gate structure is embedded;
a second dielectric layer disposed over the first dielectric layer;
a third dielectric layer disposed over the second dielectric layer; and
a gate contact contacting the gate electrode layer passing through the third dielectric layer, the second dielectric layer the second cap insulating layer and the first cap insulating layer,
wherein the second sidewall spacers and the second cap insulating layer of each of the first and second gate structures are in contact with the second dielectric layer,
the second sidewall spacers and the first cap insulating layer are continuous, and
uppermost surfaces of the first sidewall spacers extend above a lowermost surface of the first cap insulating layer, and the uppermost surfaces of the first sidewall spacers extend below an uppermost surface of the first cap insulating layer.

17. The semiconductor device of claim 16, further comprising:
a source/drain epitaxial layer disposed between the first and second gate structures and protruding from the fin structure;
a source/drain conductive plug disposed on the source/drain epitaxial layer; and
a source/drain cap insulating plug disposed on the source/drain conductive plug,
wherein the source/drain cap insulating plug is made of at least one selected the group consisting of SiC and SiOC.

18. The semiconductor device of claim 1, wherein the uppermost surfaces of the first sidewall spacers extend above an uppermost surface of the gate electrode layer.

19. The semiconductor device of claim 9, wherein the lowermost surface of the first cap insulating layer is disposed in contact with an uppermost surface of the gate electrode layer.

20. The semiconductor device of claim 16, wherein the uppermost surfaces of the first sidewall spacers are disposed between an uppermost surface of the gate electrode layer and a lowermost surface of the second cap insulating layer.

* * * * *